United States Patent [19]

Chen et al.

[11] Patent Number: 5,760,409
[45] Date of Patent: Jun. 2, 1998

[54] DOSE CONTROL FOR USE IN AN ION IMPLANTER

[75] Inventors: Hank Chen, Rowley; Frank Sinclair, Quincy, both of Mass.; Michiro Sugitani, Niihama Ehime, Japan

[73] Assignee: Eaton Corporation, Cleveland, Ohio

[21] Appl. No.: 785,013

[22] Filed: Jan. 17, 1997

Related U.S. Application Data

[60] Provisional application No. 60/019,915, Jun. 14, 1996.
[51] Int. Cl.$^6$ .................................................. H01J 37/317
[52] U.S. Cl. ............................................................. 250/492.21
[58] Field of Search .......................... 250/492.21, 492.2, 250/398, 397

[56] References Cited

U.S. PATENT DOCUMENTS

| | | | |
|---|---|---|---|
| 4,234,797 | 11/1980 | Ryding | 250/492.21 |
| 4,539,217 | 9/1985 | Farley | 250/492.21 |
| 4,587,433 | 5/1986 | Farley | 250/492.21 |
| 4,751,393 | 6/1988 | Corey, Jr. et al. | 250/492.21 |
| 4,816,693 | 3/1989 | Rathmell | 250/492.21 |
| 5,525,807 | 6/1996 | Hirokawa et al. | 250/492.21 |

*Primary Examiner*—Kiet T. Nguyen
*Attorney, Agent, or Firm*—Watts, Hoffmann, Fisher & Heinke Co., LPA

[57] ABSTRACT

Electrical charge neutralization effects are known to be factors that affect the dose or concentrations of beam treatment by high current implanters. Raising beam energies to 1 MeV and beyond requires an understanding of the effects of both charge stripping and charge neutralization as well as a numerically efficient model compensating for these effects. Charge stripping generates ions of a higher charge state and may cause the measured electronic current from a Faraday cup to overestimate the true particle current. An analysis is based on the concept of an effective charge state for an ion beam and results in a more general interpretation that covers both the charge stripping effect as well as ion neutralization. Dose control using the techniques requires two adjustable parameters: an apparent cross section of interaction between the beam and particles in the beam path and the ratio of the final steady charge state to the initial charge state.

8 Claims, 4 Drawing Sheets

DOSE CONTROL FOR USE IN AN ION IMPLANTER

This application claims priority of previously filed U provisional application Ser. No. 60/019,915, filed Jun. 14, 1996.

FIELD OF THE INVENTION

The present invention relates generally to ion implanters and more specifically to a method and apparatus for controlling ion dose or concentration implanted into semiconductor wafers.

BACKGROUND ART

Ion implantation wherein a beam of ions is directed at a semiconductor wafer is now widely used in a variety of industrial applications, especially in the implantation of semiconductors for manufacturing electrically active devices. U.S. Pat. Nos. 4,587,433 to Farley and 4,234,797 to Ryding describe the importance of controlling ion dose implanted into a workpiece. The disclosures of the '433 patent to Farley and the '797 patent to Ryding are incorporated herein by reference. The allowable tolerances on the uniformity and the total dose of the implants in the manufacturing of semiconductor devices are now at the 1% level in many applications.

To achieve this level of accuracy on the type of implanters disclosed in these two patents, it is necessary to take into account the neutralization of the ions along the beam path as a result of collisions with residual atoms and electrons in the implanter volume.

Faraday cages trap and measure the ion beam current while blocking the electrons which might accompany the ion beam. Such Faraday cages do not measure neutral atoms in the ion beam. Since neutralized atoms have essentially the same energy as the ions and are individually equivalent to them insofar as implantation dose is concerned, if significant neutralization of the beam takes place, the Faraday cage reading will give a false measure of the implantation current.

Prior art ion implanters are of particular utility in treating photoresist coated semiconductor surfaces which outgas, volatilize or sputter the photoresist. When the implanter vacuum is low enough, the implanted species are essentially all in the same charged state selected by the analyzing magnet of the implanter. If, however, the pressure along the path between the analyzing magnet and the workpiece is not low enough, the ion beam may change its charge state through atomic collisions with residual gas atoms along the beam path without undergoing a significant change in energy. In this event, the beam striking the Faraday cage may contain neutral atoms. These neutralized particles are the desired species and have the desired energies for the implantation. The neutralized ions should be counted in the ion beam flux when determining appropriate dose of the resulting ion implantation. Since the Faraday cage is not capable of measuring this beam current however the sensed ion current is less than its actual value.

At low beam energies, the primary affect of beam particle interactions is ion neutralization. The '433 patent to Farley uses a technique for adjusting beam intensity based on ion beam neutralizations. While the formulations of the '433 patent may be suitable for relatively low energy ion implanters, at higher energies stripping of electrons from ions within the beam becomes more likely than charge neutralization. Singly positively charges ions, as an example, that have had an additional electron stripped appear to contribute only half the dose one would attribute to that ion based upon its charge in the system which electrical beam current is used to control the dose. Hence, the sensed ion current is greater than the actual current. While the '433 Farley patent recognizes that charge stripping can occur, (See col 2 line 54) the formulas developed in this patent are limited to calculations based on ion neutralization.

DISCLOSURE OF THE INVENTION

The present invention provides improved dose control at high beam energies where ion stripping tends to dominate rather than ion neutralization. In accordance with one embodiment of the invention an implanter includes a target chamber, an ion source and structure for forming an ion beam from ions exiting the source and directing the ion beam to impact one or more workpieces within said target chamber.

A preferred dose control system for controlling the dose of ions implanted into said workpiece includes a sensor such as a Faraday cage for determining a sensed beam intensity of an ion beam at the target chamber. A implant controller determines beam current from the sensed beam intensity by taking into account both charge stripping and charge neutralization of ions within the ion beam caused by interactions between the ions that make up the beam and residual gas molecules encountered by the beam along the beam path to the target.

To determine a compensated ion beam current, the implant controller receives a first input, a table gives the amount of compensation at various pressure in finite increments or intervals based on the parameters specified in the recipe to be implanted, that provides an indication of the relative concentration of ions having an initial and different final charge state due to interactions with the gas molecules in the ion beam path before the ions strike the workpieces. This indication will vary depending on whether charge stripping or ion neutralization is the dominant ion/molecule interaction. A second input to the implant controller is an indication of gas molecule pressure at a location upstream from the workpieces along the ion beam path. The implant controller uses these two inputs to adjust implant dose based upon a modified ion beam current that takes into account both charge stripping and charge neutralization.

In accordance with a preferred embodiment of the invention a relation is used of the form $I_m = (I_o)[1+(\gamma-1)(1-e^{-KP})]$, wherein $\gamma$ is a ratio of charge states for particles moving within the ion beam toward the workpieces, P is the gas pressure within a region bounded by structure between the ion source and the target chamber, and K is a cross section of beam particle gas interaction.

The value of gamma ($\gamma$) is determined from collected data. A best fit approximation is used to determine gamma based on data that is recorded every 150 milliseconds during an implantation.

The gamma values, in terms of ion species, initial charge state and energy, will be provided in a look-up table stored in the ion implanter controller as a default value that can be overriden at a controller console by the user. Normally, however, the user need only determine the second parameter, K during machine setup and enter that value at the console since a fault gamma is chosen if not overridden by the user.

Practice of the invention provides an additional parameter to allow more accurate description of the ion beam current as a function of process chamber pressure. This in turn allows the dose control to be updated on a real time basis in a way that improves upon the prior art Eaton dose control procedures that are described in the Farley and Ryding patents.

These and other objects, advantages, and features of the present invention will become better understood from a review of the accompanying detailed description of the invention which is described in conjunction with the accompanying drawings.

BEST MODE FOR PRACTICING THE INVENTION

Figure 1:
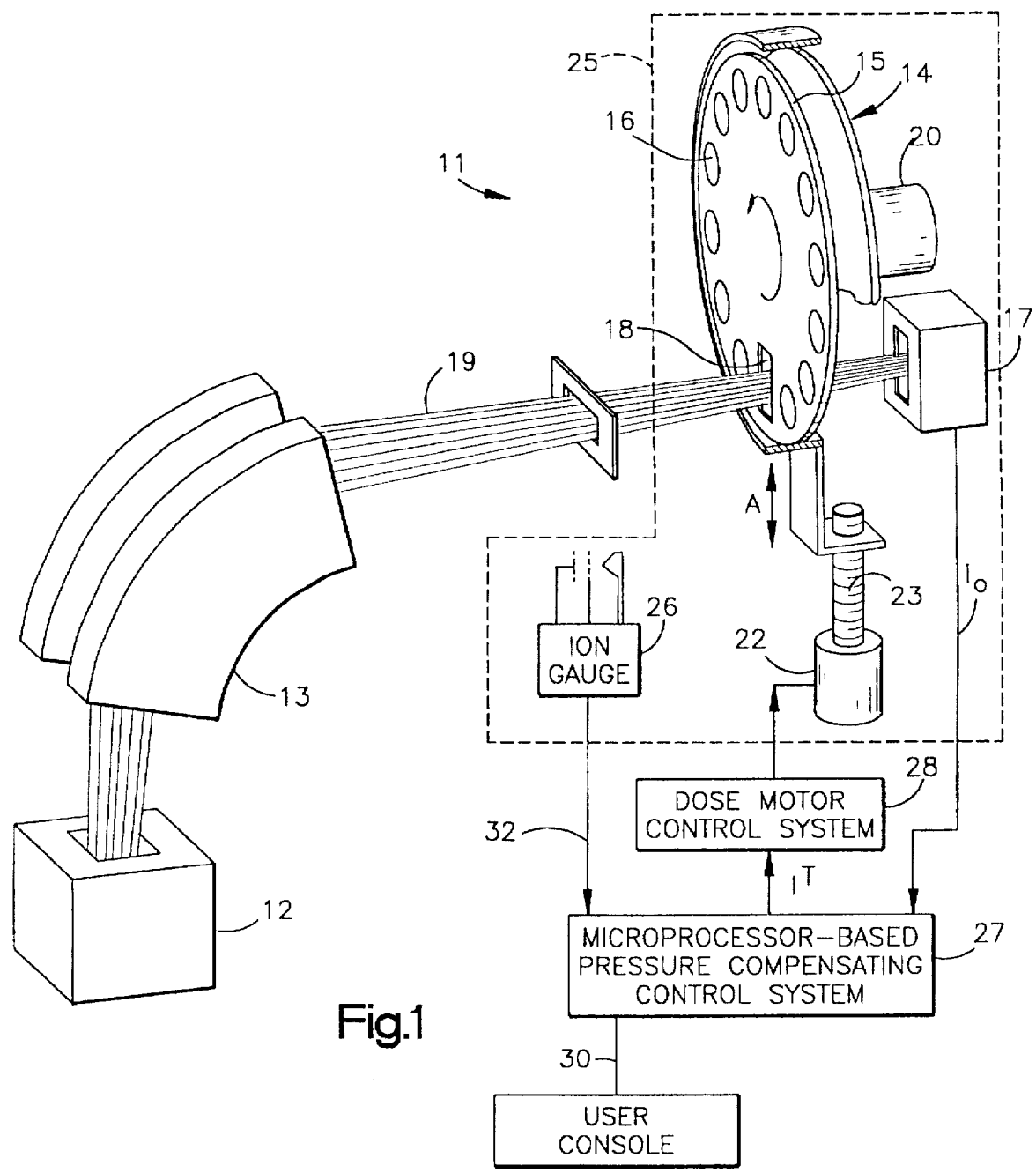
FIG. 1 is a schematic view of a representative ion implantation system incorporating measurement and control elements applicable to the present invention.

FIG. 1 depicts an ion implanter 11 having components for generating an ion beam including an ion source 12, an analyzing magnet 13, a rotating disk assembly 14 including a disk 15 on which workpieces 16 are mounted for implantation and a Faraday cage 17 which is used to measure the ion beam current which passes through a slot 18 formed in the disk 15. As is well known in the ion implantation art, certain ion species are selected by the analyzing magnet 13, resulting in a beam 19 of the selected species being directed against the workpieces 16.

As set forth in U.S. Pat. No. 4,234,797 to Ryding, which is incorporated herein by reference, the support 15 is rotated at a constant angular velocity by a motor 20 mounted on the disk assembly 14. During beam treatment of the workpieces on the support the disk assembly is moved in the direction of the arrow A by means of a stepper motor 22 and lead screw 23 at a rate which is determined by the dose as measured by the Faraday cage 17 to insure the uniform implantation of the workpiece 16.

As is well known in the art, ion implantation is carried out under high vacuum conditions, with the disk assembly 14 and the Faraday cage 17 defining an end station or target chamber designated by the broken line 25 in FIG. 1. The present invention provides a means for accounting for charge state changes of the ions that make up the beam when controlling implantation dose. The dose determination is based on ionization current measurements and the gas pressure at the end station of the ion implanter.

End station pressure is measured by an ionization gauge 26. Collision of the primary positive ion beam 19, designated as having an incident current $I_o$, with gas atoms along the beamline downstream from the resolving magnet causes electrons to be added to (neutralization) or taken from (stripping) some of the positively charged ions in the beam. The degree to which this occurs is described in U.S. Pat. No. 4,587,433 as depending on the ion species, the ion velocity and the gas concentration or density through which the beam passes.

A implant controller 27 calculates beam current from the sensed beam intensity by taking into account both charge stripping and charge neutralization of ions within the ion beam caused by interactions between the ions that make up the beam and residual gas molecules to determine a compensated ion beam current. The controller 27 includes a first input 30 for inputting an indication of the relative concentration of ions having an initial and different final charge state due to interactions with the gas molecules in the ion beam path before the ions strike the workpieces and additionally including a second input 32 for inputting an indication of gas molecule pressure P at a location upstream from the workpieces along the ion beam path. A dose controller 28 coupled to the stepper motor 22 adjusts an Implant dose based upon the ion beam current determined by the controller 27. The controller 28 responds to modified current signals transmitted to the controller 28 from the implant controller 27.

THEORY OF THE INVENTION

Consider two charge states, an initial charge state and a final charge state. Assume the ion beam is made up of ions having these two charge states. Initially, as the ions leave the resolving magnet, there are $N_1$ ions having an initial charge $q_1$ traveling toward the implant chamber. After traveling a fixed path length at a pressure P, a number of the ions, $N_2$, have changed to the steady charge state, $q_2$ due to the charge exchange or electron stripping interactions, leaving $N_1$ ions remaining in the initial charge state $q_1$. The total charge that reaches the Faraday cup will be $(q_1N_1+q_2N_2)$. This can be described mathematically as:

$$N_1 \xrightarrow{K} N_2,$$

where $K$ is a proportionality factor related to pressure.

$$dN_1 = -KN_1 dP \longrightarrow N_1(P) = N_I e^{-KP}$$

$$N_2(P) = N_I - N_1(P) = N_I(1 - e^{-KP})$$

$$\begin{aligned}Q_{total} &= q_1 N_1 + q_2 N_2 \\ &= q_1(N_I)[1 + (q_2/q_1 - 1)(1 - e^{-KP})] \\ &= q_1(N_I)[1 + (\gamma - 1)(1 - e^{-KP})]\end{aligned}$$

where $\gamma = q_2/q_1$.

In terms of measured electrical beam current, Im, at pressure P from outgasing and the beam current with no outgasing, I0:

$$I_m = I_0[1+(\gamma-1)(1-e^{-KP})] \qquad \text{Equation 1}$$

With more elaborate modeling which allows recycling, $$N_1 \underset{K_{21}}{\overset{K_{12}}{\rightleftarrows}} N_2$$

leads to the differential equation set:
$$dN_1 = (-K_{12}N_1 + K_{21}N_2)dP$$

-continued
$$dN2 = (-K_{21}N_2 + K_{12}N_1)dP$$

which upon integration gives:
$$I_m = I_0[1 + (K_{12}/(K_{12} + K_{21}))(\gamma - 1)(1 - e^{-KP})]$$

For three different charge state (i−1, i, i+1) without recycling, the following equations obtain:

$$-dN_i(P) = (\sigma_{i-1}^i + \sigma_{i+1}^i)N_i dP$$

$$dN_{i+1}(P) = \sigma_{i+1}^i N_i dP$$

$$dN_{i-1}(P) = \sigma_{i-1}^i N_i dP$$

and the solutions as follows:

$$I_m = I_0[1 + K_2/i(1-e^{-KP})]$$

where i is the charge number of the initial charge state; and where $$K_1 = \sigma_{i-1}^i + \sigma_{i+1}^i$$

$$K_2 = (\sigma_{i+1}^i - \sigma_{i-1}^i) + (\sigma_{i+1}^i + \sigma_{i-1}^i)$$

where $I_m$ is the measured beam current (based on net charge) and $I_0$ is the atomic beam current.

ASSUMPTIONS

From these different functions, an ion implantation scheme has been implemented using the relation $I=(I_0)[1+(\gamma-1)(1-e^{-KP})]$ to model the charge exchange/electron stripping behavior of ions in ion beams having on the order of one MeV of energy as well as at low energy.

The functional relation in the Farley and Ryding patents can be described as a special case of the present technique when gamma ($\gamma$) equals zero. When gamma equals zero, the relation reduces to $I_m=I_0 e^{-KP}$ under the premise that only neutralization takes place and no charge is carried by the dopant through residual gases. In this two parameter equation, the $\gamma$ value has a simple interpretation as the ratio of final steady charge state to the initial injected charge state and K is the interaction cross section in terms of gas pressure.

The equation $I=(I_0)[1+(\gamma-1)(1-e^{-KP})]$ improves the model that describes the relationship between measured beam current and gas pressure using two parameters, gamma and K, by which the applicable energy range is broadened upward from a few hundred KeV to several MeV. With appropriate selection of gamma and K, the deviation of measured beam current from actual atomic beam current at any given pressure inside the pressure range encountered by the implanter can be correctly calculated within statistical limits.

Figure 2:
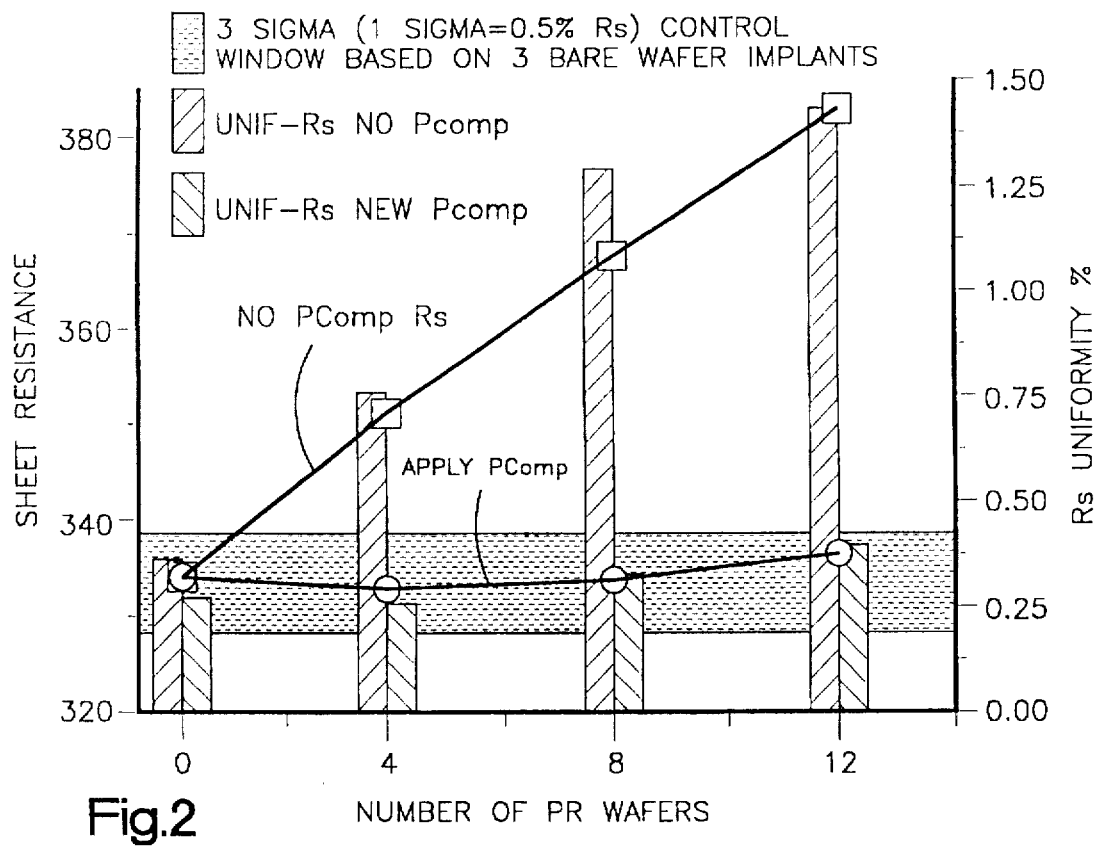
FIG. 2 is a graph showing a percentage of ions in each charge state as a function of 30 keV $Te^{+1}$ ions travel length in a Mg vapor.

The functional form of equation 1 was fitted against data taken from Heinemeier & NIM 148 (1978) 65 for Te$^{+1}$. This data is unusual in that the equilibrium charge state is negative. As shown in FIG. 2, the proposed formulation with $\gamma=-0.625$ gives a good fit.

EQUIPMENT & CONFIGURATION

The disclosed model was tested by modifying Eaton Corporation's prior art dose control algorithm that is disclosed in the Ryding patent. The pressure compensation algorithm compensates the measured beam current error in real time with instanteious pressure reading based upon the relationship stated in the model. Data provided here were generated by experiment on Eaton ion implanter model number NV GSD/VHE #29.

1. All the monitor wafers were 200 mm.
2. All the implant angle were $\alpha/\beta$ of (5°, 1.5°) which is equivalent to $\Theta/\phi$ of (5.22°, 16.72°).
3. The ion gauge used for the test was "STABIL-ION gauge" made by Granville-Phillips.
4. Eaton's standard 10" and 8" cryo pump and backside cryo pump, 250F made by CTI-CRYOGENICS.
5. All the photoresist wafers used in the test had 4 mm thick, un-baked and un-patterned photoresist mask.
6. Therma Wave Thermaprobe 400xp for Therma Wave measurement.
7. HTEC Rapid Thermal Processor for thermal anneal.
8. Prometrix RS-55/tc for sheet resistance measurement.

In order to test the proposed model under a wide dynamic pressure range, each test recipe was repeated 4 times with 0, 4, 8, and 12 photoresist coated wafers out of a total 13 wafers for each implant. The parameter settings for $\gamma$ and K used for the pressure compensation based on this model were estimated based on data generated during these tests. These test results show the potential of this proposed model in controlling this photoresist outgasing effects.

K FACTOR DETERMINATION

The test data was used to calculate K-factors in accordance with a prior art technique described in a technical note entitled "Best Methods and Practices for Pressure Compensation" which is incorporated herein by reference. The K factor is determined using a graphical technique requiring a minimum of four implant runs (under a same gamma factor determined prior to the test). The K factor varies with implanter model, ion species, residual gas species, energy and beam current. The two most significant effects are implant specie and energy.

During the tests to determine the K factor the implanter should be clean and the implanter should be set to run the specie and energy being optimized. As outlined in the technical note an appropriate K factor is determined by means of a graphical analysis from the four or more implant runs and a plot of sheet resistivity versus K factor. One run is performed with bare wafers and with a K factor of zero. A second run is performed with bare wafers and higher, more typical K factor. The third and four runs are performed with a number of photoresist coated wafers and the same K factors chosen for the first two runs. By plotting graphs of implanted wafer resistivity vs K, an intersection point of the two sets of data (coated and uncoated) yields an optimum K factor.

The gamma factor will be determined prior to the determination of K: either by a default value (or customer specified) or a value obtained from a best fit method. In this later case, one can arrange the minimum required four implant runs for determining the optimum K Factor in the sequence which photoresist coated wafers and K=0 from the first implant to obtain the data required to determine the value of gamma. Once the initial gamma is determined, then the remaining three implants are perfomed using the determined value of gamma. Since K=0 is used in the first implant, no compensation is applied to the implant, and it makes no difference what value is used for gamma relative to that of the remaining implant runs and still comply with the runs for K factor determination are using the "same" gamma value. In this way, there is no extra implants required to implement the addition of gamma factors.

Figure 3:
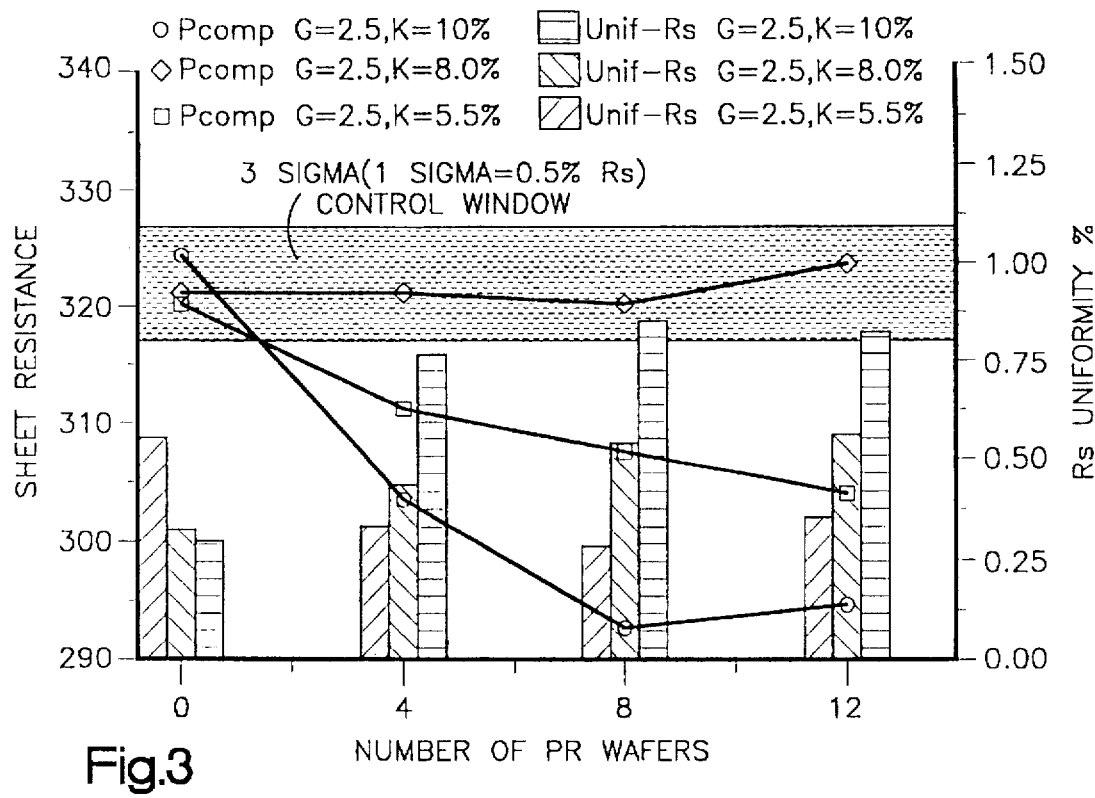
FIG. 3 is a graph of beam current vs pressure for $P^+$, 850 keV with different amounts of photoresist wafers.
Figure 4:
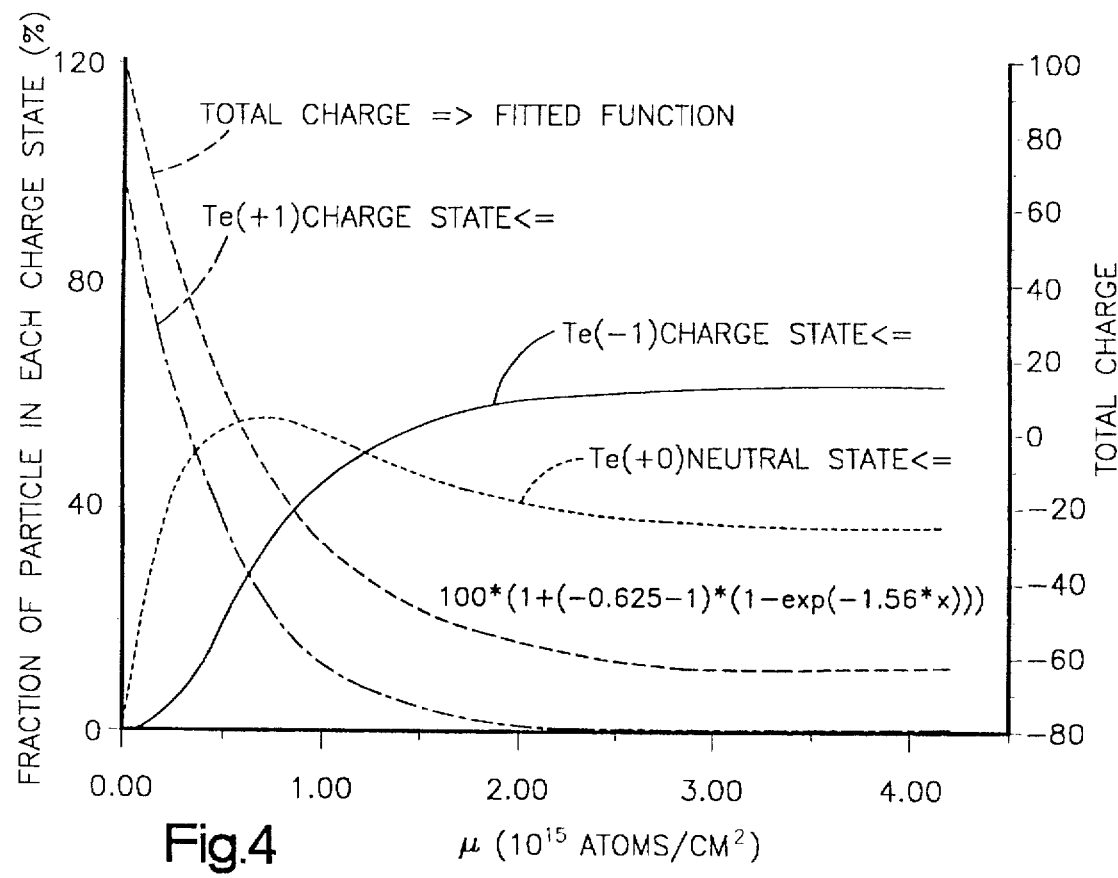
FIG. 4 is a graph of sheet resistance response with and without pressure compensation for $P^{+1}$ 850 keV at 550 μA.
Figure 5:
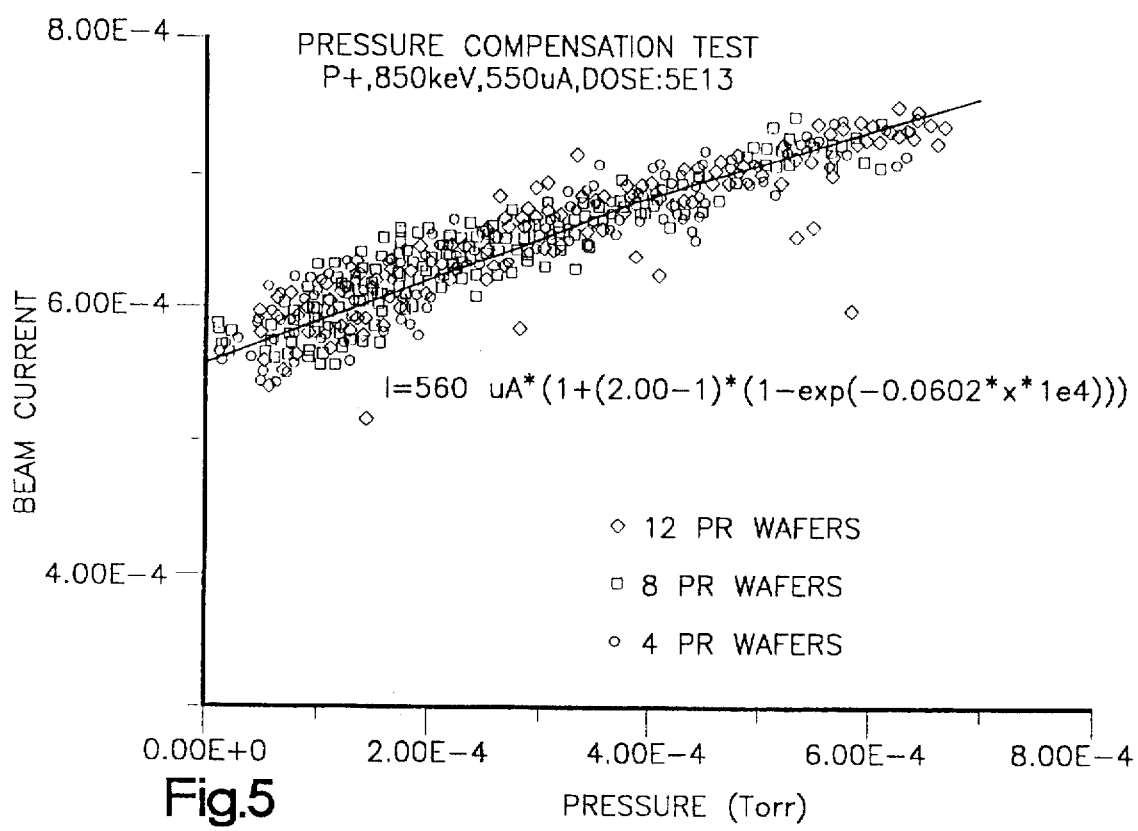
FIG. 5 is a graph showing the results of 450 μA, 1.2 Mev singly charged phosphorus with differing pressure compensation parameter settings.

The relationship of measured beam current and pressure for P$^{+1}$ (singly charged phosphorus), 850 keV at 550 uA are presented in FIG. 3, as a typical example. The measured beam current and pressure were recorded in real time every 150 msec during implant with photoresist wafers. Data from 3 implants, 4, 8, 12 photoresist wafers in each batch, were overlapped with the fitted function of Eq(1) in this graph. A key issue here is that this I vs. P relationship has to hold regardless of the pressure range as demonstrated in the graph. The sheet resistance responses of the above test with/out pressure compensation is illustrated in FIG. 4. Without this compensation, mean sheet resistance shifted by as much as 15% with a uniformity of 1.4%. After proper pressure compensation, both dose repeatability and uniformity better than 0.5% was achieved. In FIG. 5, the results of three repetitions of a similar test for $P^{+1}$ 1.2 MeV at 450 uA by varying the parameter setting are illustrated. The repeatability among implants using 0, 4, 8 and 12 photoresist wafers for the above two cases are 0.40% and 0.45% respectively at the proper setting.

Figure 6:
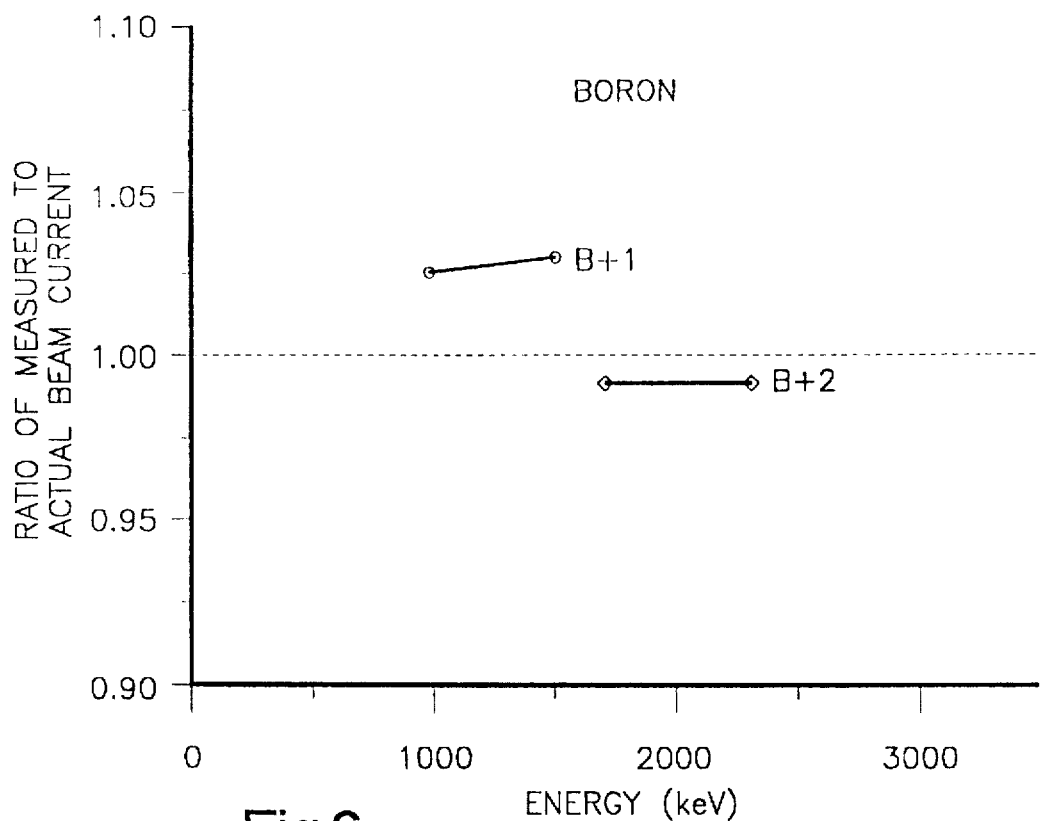
FIG. 6 is a graph showing a trend of electron stripping and charge neutralization for boron at a pressure of $10^{-4}$ Torr.
Figure 7:
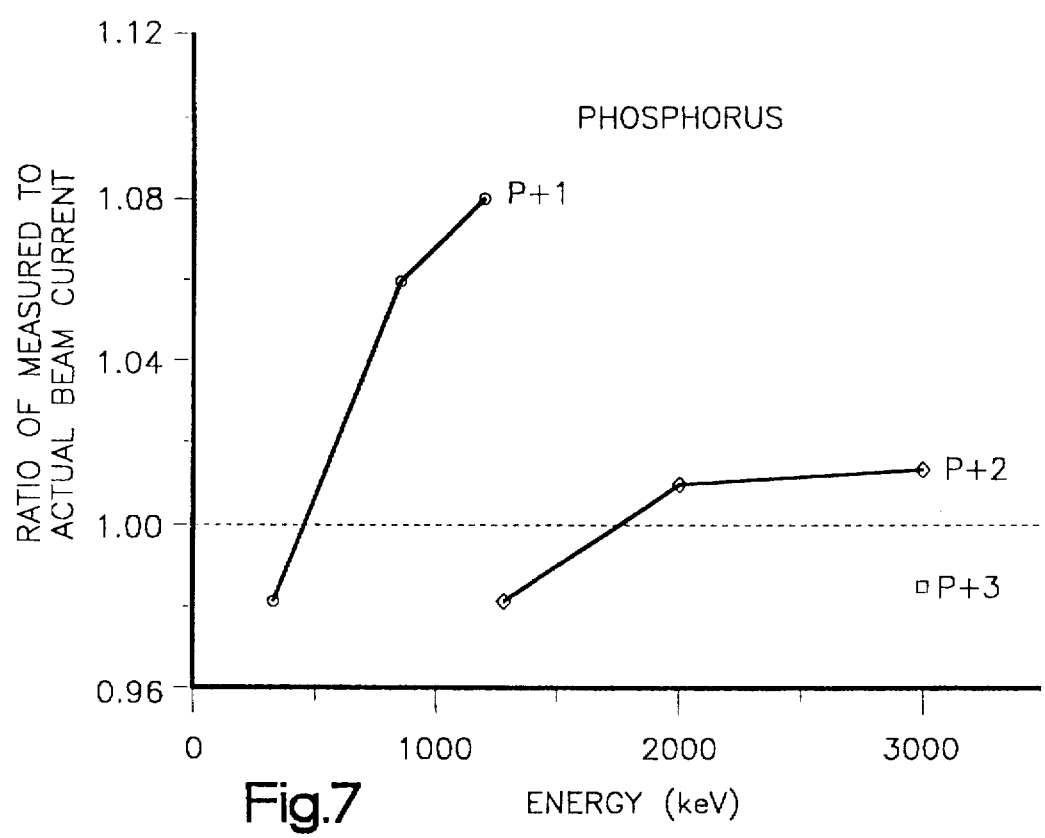
FIG. 7 is a graph showing trends of electron stripping and charge neutralization for phosphorus at a pressure of $10^{-4}$ Torr.

The trend of electron stripping and charge neutralization as a function of ion energy and initial ion charge state is shown in FIG. 6 & FIG. 7. The ratio, electrical measured beam current to the real beam current, on the Y-axis was based on the predicted beam current at Pressure $10^{-4}$ Torr after a best fit to all the data points at various pressure for each test recipe. This ratio is greater than one when the dominant effect is electron stripping. In general, singly charged ions at high energy show the most significant pressure related dose shift as compared with ions at double or triply charge state. One apparent reason is that the dose error is proportion to the measured charge error divided by the initial charge state of incident ion. The other possible reason is that the cross section of electron stripping is smaller with the increasing of initial charge state in parallel to a competing process of charge neutralization.

The invention has been tested by embodying it into the Eaton dose pressure compensation algorithm. Use of the algorithm eliminates the photoresist outgasing induced dose shift and produces good dose uniformity and dose accuracy even under the most extreme condition. This two parameter model is not only able to successfully characterize the charge state variation under photoresist outgasing but is also practical enough to be routinely used.

The ion implanter dose controller 27 contains a compensation look-up table that is generated before an implant begins as the first input for calculating the compensated beam current. The compensation table has a table of percentage compensation values at various pressures in finite increments or intervals which is calculated based on (removing a given set of) a given set of gammas and K factors specified in the recipe to be implanted. By means of the table look-up technique (i.e. by finding a corresponding value at a given value of dependent variable by interpolation) the dose controller calculates the compensated beam current using real time pressure readings, the second input, much faster than requiring calculation on a real time basis of the entire equation. The corrected beam current as an output signal to drive the up and down scan (y scan) to achieve a proper dose control.

A preferred embodiment of the present invention has been described with a degree of particularity. It is the intent, however, that the invention include all alterations and modifications from the disclosed design falling within the spirit or scope of the appended claims.

We claim:

1. An ion implanter comprising a target chamber, an ion source and structure for forming an ion beam from ions that have exited from the ion source and directing the ion beam to impact one or more workpieces within said target chamber, and a dose control system for controlling the dose of ions implanted into said workpiece, said ion implanter comprising:

a) sensor means for determining a sensed beam current of an ion beam at the target chamber;

b) compensation means for determining a compensated beam current from the sensed beam current by taking into account both charge stripping and charge neutralization of ions within the ion beam caused by interactions between the ions that make up the ion beam and residual gas molecules to determine a compensated ion beam current, said compensation means including a first input for inputting an indication of the relative concentration of ions having an initial and both lower and higher final charge states different from the initial charge state due to interactions with the gas molecules in the ion beam path before the ions strike the workpieces and including a second input for inputting an indication of gas molecule pressure at a location upstream from the workpieces along the ion beam path and including compensated beam current determining means for adjusting the sensed beam current from the first and second inputs; and c) dose control means for adjusting implant dose based upon the compensated ion beam current determined by the compensation means.

2. The ion implanter of claim 1 wherein the implanter additionally comprises a workpiece support mounted within the target chamber and wherein the workpiece support is mounted to position said workpieces on the support within the chamber for treatment by the ion beam and wherein the dose control means controls the movement of the workpiece support as ion treatment of the workpieces takes place.

3. The ion implanter of claim 1 wherein the compensation means includes a processor for determining on a real time basis the instantaneous beam current.

4. The ion implanter of claim 3 wherein the processor includes a stored program for calculating a modified ion beam current ($I_0$) based upon measured beam current ($I_m$) from the sensor means in accordance with the relation $I_m=(I_0)[1+(\gamma-1)(1-e^{-KP})]$, wherein $\gamma$ is an experimentally determined ratio of charge states for particles moving with the ion beam toward the workpieces and P is the gas pressure within a region bounded by said structure between the ion source and the target chamber, and K is a cross section of beam particle gas interaction.

5. A method of calculating dose for use in an ion implanter having an ion source and an analyzing magnet for creating a beam of ions having a specified charge to mass ratio, said method comprising the steps of:

a) directing a beam of ions having multiple possible charge states including a neutralization state to a target chamber containing one or more workpieces that are to be treated by the beam;

b) as beam treatment of the one or more workpieces takes place within the target chamber, periodically determining a sensed ion beam current by directing the ion beam to an intensity sensor; and c) determining a calculated ion beam current based upon a proportion of ions within the ion beam that have both higher and lower charge states than the charge state of ions leaving the analyzing magnet.

6. The method of claim 5 wherein the step of determining said calculated ion beam current comprises the substep of calculating a modified ion beam current $I_0$ based upon measured beam current $I_m$ in accordance with the relation $I_m=(I_0)[1+(\gamma-1)(1-e^{-KP})]$, wherein $\gamma$ is a ratio of charge states for particles moving with the ion beam toward the workpieces, P is the gas pressure within a region bounded by structure between the ion source and the target chamber, and K is a cross section of beam particle gas interaction.

7. A method for controlling the dose of ions in an ion implanter comprising a target chamber, an ion source and structure for forming an ion beam from ions that exit from the ion source and directing the ion beam to impact one or more workpieces within said target chamber, comprising the steps of:

a) sensing beam current of an ion beam at the target chamber;

b) determining an adjusted beam current from the sensed beam current by taking into account both charge stripping and charge neutralization of ions within the ion beam caused by interactions between the ions that make up the beam and residual gas molecules to determine a compensated ion beam current, said determining step including the substep of first determining an indication of the relative concentration of ions having an initial and different final charge state due to interactions with the gas molecules in the ion beam path at boundary conditions of low gas and high gas pressure and additionally including a second substep of determining gas molecule pressure at a location upstream from the workpieces along the ion beam path during ion implantation and determining beam current for said sensed gas molecule pressure from the ratio determined in said first substep; and c) controlling implant dose based upon the ion beam current determined during the determining step.

8. The method of claim 7 wherein the second substep comprises the step of calculating a modified ion beam current $I_0$ based upon measured beam current $I_m$ in accordance with the relation $I_m=(I_0)[1+(\gamma-1)(1-e^{-KP})]$, wherein $\gamma$ is a ratio of charge states for particles moving with the ion beam toward the workpieces, P is the gas pressure within a region bounded by structure between the ion source and the target chamber, and K is a cross section of beam particle gas interaction.

* * * * *